United States Patent

Sakamoto et al.

[15] 3,672,047

[45] June 27, 1972

[54] METHOD FOR BONDING A CONDUCTIVE WIRE TO A METAL ELECTRODE

[72] Inventors: Yuzaburo Sakamoto; Morio Toyooka, both of Tokyo, Japan

[73] Assignee: Hitachi, Ltd., Tokyo, Japan

[22] Filed: Dec. 29, 1970

[21] Appl. No.: 102,309

[30] Foreign Application Priority Data

Dec. 29, 1969 Japan ................................44/105284

[52] U.S. Cl. ..............................29/628, 29/470.5, 29/471.1, 29/497.5

[51] Int. Cl. ....................................H01r 43/00, H05k 43/00

[58] Field of Search ..................29/471.1, 471.7, 470.5, 482, 29/487, 628, 497.5

[56] References Cited

UNITED STATES PATENTS

| | | | |
|---|---|---|---|
| 3,087,239 | 4/1963 | Clagett | 29/628 X |
| 3,252,203 | 5/1966 | Alberts et al. | 29/471.1 X |
| 3,389,457 | 6/1968 | Goldman et al. | 29/471.1 X |
| 3,397,451 | 8/1968 | Avedissian et al. | 29/628 X |
| 3,430,835 | 3/1969 | Grable et al. | 29/497.5 |
| 3,458,780 | 7/1969 | McDaniel | 29/628 X |

*Primary Examiner*—John F. Campbell
*Assistant Examiner*—Richard Bernard Lazarus
*Attorney*—Craig, Antonelli & Hill

[57] ABSTRACT

A connector wire is bonded to a solder electrode by pressing the end portion thereof to the solder electrode by using a capillary while the capillary is heated up to a temperature not less than the melting point of the solder, by melting the solder electrode and then by cooling the whole bonding area of the connector wire and the solder electrode, thereby the end portion of the connector wire is buried in the solder electrode and is firmly fixed thereto.

9 Claims, 5 Drawing Figures

Figure 1A:
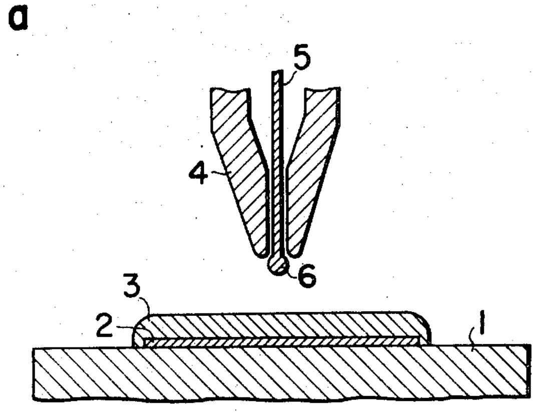

INVENTORS
YUZABURO SAKAMOTO & MORIO TOYOOKA
BY
Craig, Antonelli,
Stewart & Hill
ATTORNEYS

INVENTORS

YUZABURO SAKAMOTO & MORIO TOYOOKA

BY

Craig, Antonelli, Stewart & Hill

ATTORNEYS

METHOD FOR BONDING A CONDUCTIVE WIRE TO A METAL ELECTRODE

This invention relates to a method for bonding a conductive wire to an electrode terminal or conductor formed on a semiconductor or insulating substrate.

Generally, there are several known methods for connecting a metal wire to an electrode of a semiconductor device. For example, a thermo-compression bonding method may be used wherein a metal wire, such as gold, and a bonding area on an aluminum electrode are heated and the two are then pressed together; and an ultrasonic bonding method is also available wherein a metal wire is pressed on the bonding area of an electrode with a predetermined force and ultrasonic vibration is then applied thereto. However, there are disadvantages when these methods are applied to an electrode formed on a relatively weak substrate of a semiconductor element. Where high pressure is used a mechanical breakdown in the form of cracks, for example, occurs in the substrate due to the stress of the high pressure, and when low pressure is used, the bonding is often found to be incomplete.

Also, the above-mentioned methods are not always applicable to all cases. For example, in a hybrid integrated circuit device, since an interconnection layer comprising a metallized layer formed on an insulating substrate by a printing technique generally involves bonding material such as glass in metal powder, a metal wire cannot be bonded to the substrate firmly by thermo-compression bonding or ultrasonic bonding. In this case, a metal, for example gold, may be selectively deposited on the bonding area of the metallized layer by plating or any known evaporating technique to firmly connect the metal wire to the metallized layer by thermo-compression bonding or ultrasonic bonding. However, there is a disadvantage in such a method in that a selective plating or evaporating step is needed, thereby complicating the manufacturing process.

Since a soldering method applied to a metal electrode of a low melting point metal (hereinafter referred to as a soldered electrode) has advantages in that the bonding strength is strong and a relatively thick metal wire can be used in comparison with the above-mentioned bonding methods, such a soldering method is also applicable for the interconnections in high power circuit semiconductor devices. There are several types of methods for bonding a metal wire to a soldered electrode, for example:

1. A method wherein a metal lead wire from a case is directly connected, or connected through a metal wire known as a connector wire, to an alloy electrode of an alloy junction type transistor, or a metal wire is disposed between the solder plating electrode and the lead wire of the case, and both the metal wire and the electrode are partially heated by a hydrogen flame to melt the alloy or the solder when the metal wire is in contact with the electrode.
2. A method wherein a solder layer is formed on a metallized interconnection layer, as in a hybrid integrated circuit device and the like, and a metal wire is disposed between each bonding area in contact therewith, and soldered in the same way as usual for electronic parts.
3. A method wherein in an alloy junction type transistor a metal wire is first sunk into an electrode by using a capillary, and the electrode is then heated by a hot blast of hydrogen flame etc. to solder the metal wire thereto after the metal wire is fixed on the electrode.
4. A method wherein an electric current is applied to a metal wire to generate Joule heat and the heat is conducted to a soldered electrode, thereby the metal wire is sunk into the solder electrode with melting of the electrode.

In the methods (1) through (4), the method (1) needs a relatively long time for bonding since the whole bonding area and a portion adjacent thereto must be heated, and there is a fear that the relative position of the solder electrode and the metal wire will change during the course of the method. The method (2) requires separated bonding steps, therefore, it has the disadvantage of being complicated. The method (3) needs a hot blast heating device and a hot blast heating step, and the operation of this method is therefore also complicated. The method (4) also has disadvantages in that it is difficult to apply the electric current to a lead wire of low resistivity and to an extremely thin metal wire, the thermal conduction to the bonding area is bad, and the application of the method is limited since the applied electric power is restricted. Therefore, it is difficult to apply the method (4) except for an alloy junction type transistor wherein the metal is of a material such as nickel having high resistivity and a thick sectional area.

As above described the usual methods for bonding a metal wire to a soldered electrode have respective problems or defects. Therefore, it is an object of the invention to overcome these and related problems.

Another object of the invention is to provide a new and improved method for bonding a conductive wire to a soldered electrode.

Still another object of the invention is to provide a method by which soldering can be performed extremely easily, swiftly and efficiently for bonding a metal wire to a soldered electrode.

These and other objects are accomplished in accordance with the present invention by the process comprising pressing an end portion of a conductive wire on a soldered electrode by means of a capillary which is heated up to a temperature not less than the melting point of the soldered electrode.

Figure 1B:
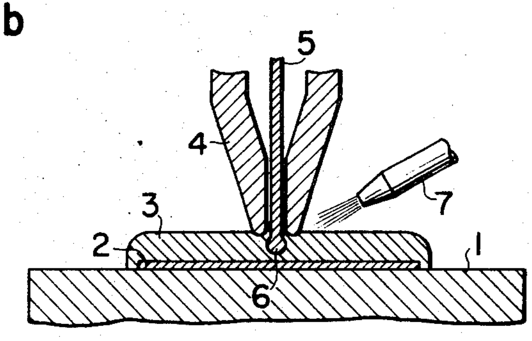
Figure 1C:
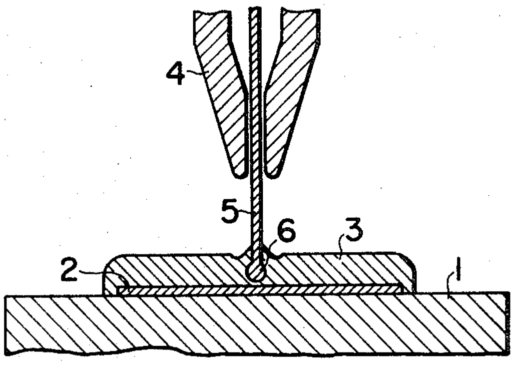
Figure 2A:
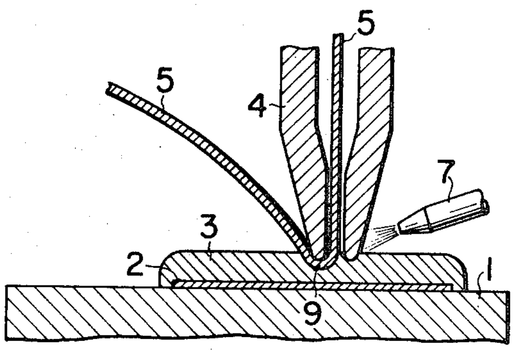

FIGS. 1*a* to *c* are cross sectional views of a capillary and a bonding area illustrating each manufacturing step of an embodiment according to the invention; and FIGS. 2*a* and *b* are cross sectional views of a capillary and a bonding area according to another embodiment.

FIGS. 1*a* to *c* illustrate the steps of an improved method for bonding a metal wire to a soldered electrode according to the invention.

An insulating substrate 1, such as ceramic, is provided in the semiconductor device, for example, a hybrid integrated circuit device. An electrode or an interconnection layer 2 is formed on the substrate 1 by a standard printing technique and a solder layer 3 consisting of lead and tin as the soldering metal is formed so as to cover the electrode 2. A guide 4 known as a capillary having a thinned end portion is disposed above the substrate and a metal wire 5 such as silver passes through the capillary 4. A point portion 6 is provided on the metal wire 5, which portion 6 called a nail head is led out from the capillary 4. A nozzle 7 of a cooling device for hardening the melted soldered electrode is also provided. In addition, the capillary 4 includes a heating means (not shown) for heating it to a predetermined temperature at an upper part and is composed of an alloy to which solder does not adhere as does the usual capillary for thermo-compression bonding. The nail head 6 of the metal wire 5 is formed by burning off the metal wire 6 by a hydrogen flame. The moving mechanism for the capillary is the same as that of the usual bonding device for thermo-compression bonding.

The bonding method according to this embodiment will be made clear in conjunction with the drawings. The capillary 4 is situated above the solder electrode 3 so as to dispose the nail head 6 at a predetermined bonding area of the solder layer 3, as shown in FIG. 1*a*. The capillary 4 is then heated up to a temperature not less than the melting point of the solder layer 3 by resistance heating means.

The temperature of the capillary may be set to any temperature not less than the melting point of the solder layer 3, but in the case of a temperature close to the melting point, it takes a long time for bonding to take place in a following step. A temperature higher than the melting point of the solder by 20° to 100° C is effective. In one example, a solder having a eutectic point of 220° C is used and the temperature of the capillary 4 is fixed at 300° C. Neither the substrate 1 nor the solder layer 3 need be heated. The substrate may be kept at room temperature, but it can be heated to a temperature not more than the melting point of the solder to soften the solder. For example, the substrate 1 may be heated to 100° C.

Then as shown in FIG. 1*b*, the capillary 4 is lowered and the nail head 6 of the silver wire 5 is pressed on the solder layer 3 by the pointed end of the capillary 4.

In this step the nail head 6 is heated to a temperature not less than the melting point of the solder layer 3 by heat conducted from the capillary 4 and pressed on the solder layer 3 with a predetermined force. Therefore, the nail head 6 is buried in the solder layer 3 while the portion of the solder layer 3 in contact with the nail head 6 is melted.

The force applied to the contact portion through the capillary 4 can be freely selected since this force has no influence on the bonding strength and has no more affect than to vary the time for bonding. As the force of the load on the nail head 6 is increased, the time needed for the bonding is shortened. For example, in the case of a silver wire of 125 microns diameter, the weight of the load is selected to be about 200 grams. In this way, the load is applied until the whole nail head 6 is buried into the solder layer 3 or the pointed end of the capillary 4 is slightly buried in the solder layer 3, then cooling gas is sprayed on the soldered portion from a nozzle 7 to harden the solder.

Then, as shown in FIG. 1*c*, the capillary 4 is pulled up while the silver wire is clamped at the upper part of the capillary so as to prevent excessive force from being applied to the soldered portion. The clamping means is used to prevent the destruction of the soldered portion caused by the large tension applied to the silver wire in the case of pulling up of the capillary. For example, the clamping means may have a structure wherein a silver wire is held between two boards with suitable pressure by utilizing the friction between the parts, but a special clamping means is not always needed for a metal wire providing means wherein large tension is not applied to the metal wire 5. In this case the nail head 6 of the silver wire 5 is left and kept in the solder layer 3 and soldered in such a state.

The above described embodiment can be applicable for the case wherein a semiconductor substrate is used in place of the ceramic substrate 1 and a metal wire is soldered to a soldering metal layer such as a solder layer formed on an electrode on the semiconductor substrate, or to a metal electrode of a low melting point in an alloy junction type transistor or further in the usual print substrate.

FIGS. 2*a* and *b* show another embodiment of this invention wherein after the metal wire, such as silver, is bonded to a portion of a solder electrode on the semiconductor substrate by the above-mentioned steps, the capillary 4 is moved over another portion of the solder layer 3 formed on the metallized layer 2 on the interconnection substrate 1 without cutting the silver wire 5 to bond the silver wire 5 to the solder electride by thermo-compression bonding.

In FIG. 2*a*, the capillary heated up to a temperature not less than the melting point of the solder layer 3 is lowered to the surface of the solder layer 3, then the hook shape portion 9 of the silver wire 5 is pressed to the solder layer 3 by the capillary 4 and is buried therein while the solder is melted, and then cooling gas is sprayed on the bonding area from the nozzle 7.

Figure 2B:
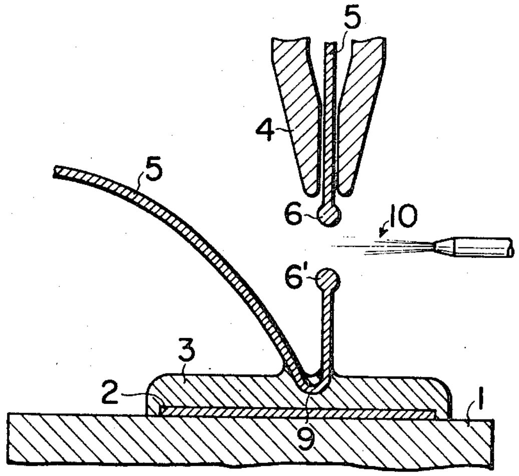

After the silver wire 5 is bonded, the capillary 4 is moved upward the the silver wire 5 is welded off by hydrogen flame 10, as shown in FIG. 2*b*. In this way, an interconnection between the electrodes by the metal wire can be completed. Therefore, these steps can be subsequently performed.

The bonding portion of the silver wire and the solder layer according to the present invention has the same strength as the breaking strength of the connector wire, in other words an extremely large bonding strength is obtained, since the end portion of the silver wire is completely buried into the solder layer without causing a change of shape thereof by an instrument, such as the capillary.

Also, since a bonding means same as a thermo-compression bonding means can be used for the embodiments and the temperature for the treatment can be uniformalized by properly selecting metal having a low melting point, the method may be used together with other methods, for example, a thermo-compression bonding method is applied to an electrode to which a heavy load for the thermo-compression bonding can be applied and soldering is applied to another electrode to which it is difficult or not suitable to apply the thermo-compression bonding method as explained by the embodiments.

As explained in connection with the various embodiments, the method for bonding a metal wire to a solder electrode according to the invention can be easily accomplished by heating a capillary up to a temperature not less than the melting point of solder without losing the merits of usual bonding methods and without the fear of applying a big stress to a bonding area using almost same operations as thermo-compression bonding and freely fixing the load.

Further the method according to the invention has many advantages in that, for example, a thermo-compression bonding device can be used by itself as the operating mechanism.

Although silver is used as the conductive wire in the above embodiments, gold may be used instead of silver.

It should be noted that it is desirable that the capillary is heated up to a temperature not less than the melting point of the metal layer but less than the melting point of the conductive wire.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What we claim is:

1. A method for soldering a conductive wire to a metal layer formed on a substrate comprising the steps of guiding said conductive wire through a passage formed in a capillary, pressing the end portion of said conductive wire onto said metal layer, heating said capillary up to a temperature not less than the melting point of said metal layer but less than the melting point of said conductive wire, whereby said conductive wire and said metal layer are heated and said end portion of said conductive wire is buried in said metal layer while said metal layer is melted, cooling said metal layer so as to firmly fix said conductive wire to said metal layer, and then pulling up said capillary, whereby said conductive wire is retained as it is bonded to said metal layer.

2. A method as defined in claim 1, wherein said conductive wire consists essentially of silver and said metal layer is solder.

3. A method as defined in claim 1, wherein said conductive wire consists essentially of gold and said metal layer is solder.

4. A method as defined in claim 1, including the further step of heating said metal layer to a temperature close to but less than the melting point thereof prior to pressing the conductive wire into the metal layer.

5. A method as defined in claim 1, wherein said metal layer comprises a metal electrode having a solder layer disposed thereon facing said capillary.

6. A method as defined in claim 1, wherein a head is formed on said conductive wire at the free end thereof protruding from said capillary prior to pressing the conductive wire into the metal layer so that said capillary exerts a force on said wire during said pressing step.

7. A method as defined in claim 1, including the further steps of moving said capillary to another position over said metal layer after it is pulled up on said wire without cutting the wire, and then bonding a second portion of the wire to the metal layer by thermo-compression bonding.

8. A method as defined in claim 7, including the further step of heating said metal layer to a temperature close to but less than the melting point thereof prior to pressing the conductive wire into the metal layer.

9. A method as defined in claim 8, wherein said metal layer comprises a metal electrode having a solder layer disposed thereon facing said capillary.

* * * * *